United States Patent [19]

King

[11] 3,783,520

[45] Jan. 8, 1974

[54] HIGH ACCURACY ALIGNMENT PROCEDURE UTILIZING MOIRE PATTERNS

[75] Inventor: Michael Charles King, Basking Ridge, N.J.

[73] Assignee: Bell Telephone Laboratories, Inc., Murray Hill, Berkeley Heights, N.J.

[22] Filed: Aug. 1, 1972

[21] Appl. No.: 276,913

Related U.S. Application Data

[62] Division of Ser. No. 75,983, Sept. 28, 1970, Pat. No. 3,690,881

[52] U.S. Cl. .................................. 33/180 R, 96/383

[51] Int. Cl. ................................................ G03c 5/00

[58] Field of Search ............... 33/327, 180 R, 184.5, 33/1 R; 96/38.3, 27; 356/250

[56] References Cited

UNITED STATES PATENTS

| | | | |
|---|---|---|---|
| 3,690,881 | 12/1972 | King | 96/38.3 |
| 3,373,499 | 3/1968 | Rothe et al. | 33/327 |
| 3,462,226 | 8/1969 | Huffaker | 101/211 |

OTHER PUBLICATIONS

M. Stecher, "The Moire' Phenomenon," 4–1964, American Journal of Physics, Vol. 32, pp.247–257.

G. Oster, "Moire' Optics : A Bibliography," 10–1965, Journal of Optical Society of America, Vol. 55, p. 1,329.

*Primary Examiner*—J. Travis Brown
*Assistant Examiner*—Edward C. Kimlin
*Attorney*—I. Ostroff

[57] ABSTRACT

A pair of moire gratings that comprise a similar pattern of concentric lines but have a different pitch are used with a microscope to provide extremely accurate alignment of objects such as a photolithographic mask and a substrate of a semiconductive material.

1 Claim, 8 Drawing Figures

HIGH ACCURACY ALIGNMENT PROCEDURE UTILIZING MOIRE PATTERNS

This is a division of application Ser. No. 75,983, filed Sept. 28, 1970, now Pat. No. 3,690,881.

BACKGROUND OF THE INVENTION

This concerns the alignment of objects using moire patterns. In particular, it concerns the alignment of the masks used in forming devices such as semiconductive integrated circuits with the substrate in which such devices are formed.

Most semiconductive devices are now made by photolithographic techniques. As is well known in the art, this requires that masks be used to define those portions of a suitable semiconductive material, such as a wafer of silicon, where various parts of the semiconductive devices are to be located. Because the different parts of these devices must be located at specified distances from each other, it is necessary to align each mask used in forming the semiconductive devices very precisely with respect to the material on which the devices are formed. Alignment is made by first locating the mask as much as thirty microns above the semiconductive wafer, or substrate, so that lateral movement of the mask or substrate will not scratch either. When the smallest details on the mask or wafer are a few microns or larger, alignment is then effected by focusing a microscope simultaneously on the mask and the semiconductive wafer and moving the wafer until visual alignment is achieved. Quite often fiducial marks on the mask and wafer are used to facilitate the alignment procedure.

While this procedure is satisfactory where alignment errors of a few microns or more are tolerable, more advanced technology requires alignment accuracy that typically is approximately one micron; and submicron accuracy may soon be needed. Achieving this accuracy is often an arduous task. To resolve one micron details on the mask and the substrate, high numerical apertures must be used in the microscope. With such apertures, however, the depth of focus of the microscope becomes so short that it is not possible to focus on both the mask and the substrate at the same time. Consequently, to achieve alignment it is necessary to refocus continually between the mask and the substrate. Besides being time consuming, this process is also impaired by the low contrast of the high power microscope and the eyestrain experienced by many of its users.

SUMMARY OF THE INVENTION

Accordingly, it is an object of this invention to facilitate alignment.

It is a further object of this invention to facilitate alignment using moire techniques.

It is still another object of this invention to use moire techniques to improve the process of aligning a mask and a wafer of semiconductive material with a microscope.

These and other objects of my invention are achieved with a pair of moire gratings both of which comprise a similar pattern of concentric lines. The pitch of these gratings, which is defined as the distance along the radius between the same two points on adjacent lines of the grating, is different. Advantageously, both gratings comprise lines that form concentric circles; and, as will be explained below, certain of these lines may be missing from one or both of the gratings in order to improve the alignment accuracy.

Alignment between a particular mask and substrate is achieved with a microscope by first forming on the substrate one of the two moire gratings. A mask bearing the other grating is then aligned with the substrate by moving the mask until a distinctive pattern of moire fringes is perceived in the alignment microscope.

Because the pattern of moire fringes observed upon alignment is readily seen, this technique can be used to achieve extremely high accuracy at high speeds. In addition, the technique can also be automated as will be detailed below.

BRIEF DESCRIPTION OF THE DRAWING

These and other objects, features and details of my invention will become more readily apparent from the following detailed description of the drawing in which.

DETAILED DESCRIPTION OF THE DRAWING

Figure 1:
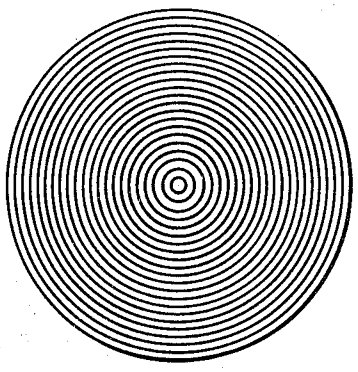
FIG. 1 is an illustration of a portion of a moire grating comprising an array of concentric annular lines.

A portion of a moire grating comprising an array of concentric annular lines is illustrated in FIG. 1. Typically, each of the lines of the grating has the same width, and the spacing between each pair of adjacent lines is the same and equal to the width of a line. The pitch of the grating is therefore twice the width of one line of the grating. The gratings I have used in my invention have had a pitch of approximately 4 or 8 microns. Gratings with still smaller pitches can also be used.

Moire gratings comprising concentric annular lines are used in my invention to achieve extremely fine alignment tolerances. Because one important use of my invention is in the fabrication of semiconductive integrated circuits and devices where precise alignment is required between a photo-lithographic mask and a wafer, or substrate, of semiconductive material in which the integrated circuits are formed, I will illustrate my invention in the context of this art.

To align a mask with a substrate, I align a moire grating on the mask with a similar moire grating at a corresponding location on the substrate. Both moire gratings are initially made by drawing them on a plotting machine, such as a Gerber Plotter, reducing them in size, and forming transparencies composed of black lines on transparent sheets. These transparencies are then used to make portions of photolithographic masks, one of which is used in forming the moire grating on the substrate and the other of which is the mask that is aligned with the substrate. The execution of the steps for forming the transparencies is straightforward for those skilled in the art of making semiconductor masks. The size of the transparencies that are made should be such that they can be used with whatever apparatus is employed in making the photolithographic masks. The amount of demagnification that is used in forming the transparencies should, of course, be such that, when combined with any demagnification during the formation of masks from the transparencies, the masks have gratings with the desired pitch.

Each moire grating preferably has a different pitch This difference is readily attained during the formation of the transparencies of the moire gratings. If the two gratings that are formed are identical except for the difference in pitch, the two transparencies can be made by plotting only one grating on the plotting machine and forming from this grating one transparency at one reduction ratio and another at a slightly different reduction ratio. However, because I prefer to modify one of the gratings as will be explained below, it may be necessary to plot each grating separately. In this case, a difference in pitch may be attained either by changing the scale of the plot or by changing the reduction ratio.

After the two transparencies are made, each is used to form a part of a photolithographic mask that defines features on the substrate of semiconductive material. As is well known, a large number of integrated circuits or devices are formed simultaneously on a wafer of semiconductive material. Accordingly, each mask in the set of masks used to form these circuits comprises the same number of identical patterns. Each of these patterns is formed photographically from a single transparency of the pattern that is inserted into a step-and-repeat camera and used repeatedly to expose a photographic emulsion from which the mask is made. To make a moire grating part of the mask, the transparency of one of the gratings is simply substituted for the transparency of the pattern during one of the exposures. Preferably, for reasons that will become evident below, this is done twice so that a moire grating is located at two different parts of the mask.

Figure 2:
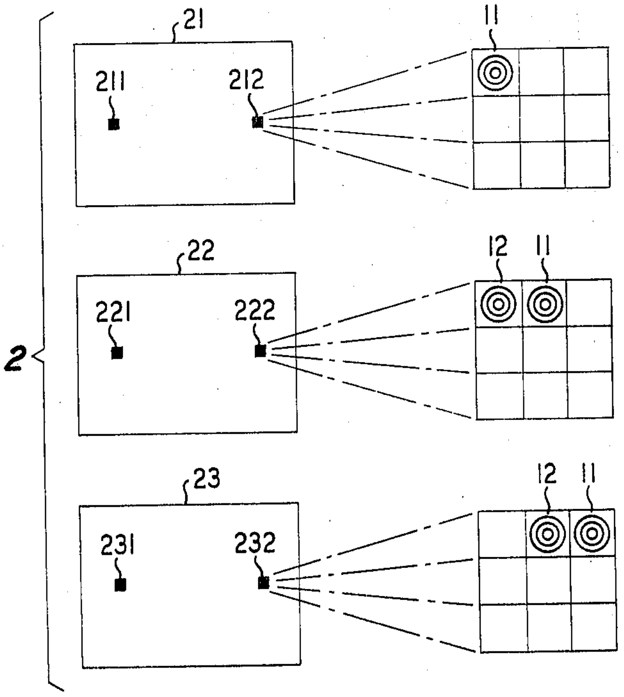
FIG. 2 is a schematic illustration of three photolithographic maps used in the practice of my invention together with blow-ups of portions of these masks.

A mask that is formed according to this procedure is schematically illustrated as element 21 of FIG. 2. Areas 211 and 212 on mask 21 designate two illustrative areas where moire gratings are formed. Most of the remaining area of the mask is filled with identical patterns that define certain features of the circuits being formed on the wafer of semiconductive material. In the blow-up of area 212, the numeral 11 in the upper left-hand corner designates the location of the moire grating formed from one of the two transparencies of the moire gratings. Illustratively, area 211 is identical.

By similar procedures, as many more masks are formed as are required in the fabrication of the particular integrated circuits being made. The second of these masks is schematically illustrated as element 22 of FIG. 2. Moire gratings are formed as above at areas 221 and 222 on mask 22, which areas have the same positions on mask 22 as areas 211 and 212 have on mask 21. Consequently, the distance between areas 221 and 222 and their angular relationship is the same as that between areas 211 and 212 on mask 21. The remainder of mask 22 contains the patterns used at this stage in the fabrication of the integrated circuit. On this mask, however, two moire gratings are formed on each areas 221 and 222. In the blow-up of area 222, the numeral 12 in the upper left-hand corner designates the location of one of these gratings. This grating is formed from the other of the two transparencies of moire gratings and therefore has a different pitch from that of grating 11 which is formed at the corresponding location on mask 21. To the right of grating 12 in area 222 is another grating that is the same as grating 11 on mask 21 and consequently bears the same numeral. The purpose of this grating will become evident below. Illustratively, area 221 is identical.

The third of the masks is schematically illustrated as element 23 of FIG. 2. This mask is similar to mask 22 with two moire gratings corresponding to the two transparencies being located at each of areas 231 and 232 which have the same positions on mask 23 as areas 221 and 222 have on mask 22. In this case, however, grating 12 is formed at the location that corresponds to the location of grating 11 on mask 22; and grating 11 is formed alongside it in the right-hand corner of areas 231 and 232. Each succeeding mask is similar with grating 12 being positioned at the location that corresponds to the location of grating 11 on the preceding mask and with a new grating 11 being alongside grating 12 on the mask.

Figure 3:
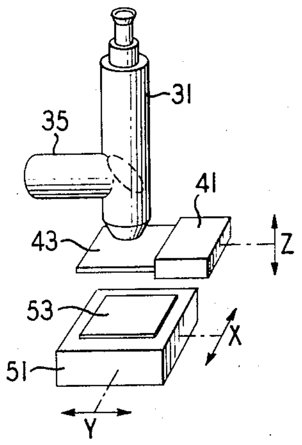
FIG. 3 is a schematic representation of illustrative apparatus used in the practice of my invention.

After the masks are made, the integrated circuits are formed following standard procedures. Illustrative alignment apparatus used in this process is shown in FIG. 3. This apparatus comprises a microscope 31, a carrier 41 for the mask, and an alignment tool 51 in which the wafer of semiconductive material is secured. Microscope 31 is any standard microscope used in the art except for the fact that it may have a relatively low numerical aperture as will be explained below. A vertical illuminator 35 is provided in microscope 31. Preferably, the appropriate aperture in the illuminator is set to produce the highest spatial coherence feasible. Carrier 41 is adapted to hold the mask so that the plane of the mask is perpendicular to the direction of propagation of light from the vertical illuminator and to move the mask in the direction z that is parallel to the direction of propagation of said light. Alignment tool 51 typically comprises a vacuum chuck for holding the wafer of semiconductive material so that its top surface is parallel to the mask and means for moving the wafer in two orthogonal directions $x$ and $y$ parallel to the mask as well as for rotating the wafer in the plane defined by these directions. In FIG. 3, this plane intersects the plane of the drawing. The direction of motion of carrier 41, as shown by the arrow, is in the plane of the drawing and normal to the top surface of the semiconductive wafer. Further details on such alignment apparatus can be found in manufacturer's catalogs as well as in R. M. Warner, Jr. and J. N. Fordenwalt, *Integrated Circuits: Design Principles and Fabrication*, (McGraw-Hill, 1965).

To begin forming the integrated circuits, first photolithographic mask 21, represented by element 43 of FIG. 3, is inserted into carrier 41. A wafer of semiconductive material, represented by element 53, is also secured to alignment tool 51. The separation between mask 43 and wafer 53 is typically about 30 microns to allow room for movement of the wafer without scratching either the mask or the wafer. In the usual case, the wafer comprises a monocrystalline block of silicon on top of which is a layer of silicon oxide on top of which is a layer of photoresist. As is well known, when the photoresist is exposed to ultraviolet light, the photoresist polymerizes to form a very hard layer that is not easily removed from the silicon oxide.

Mask 43 is then aligned with wafer 53 using light that does not polymerize the photoresist. Because this is the first step in forming circuits on the wafer, there is nothing on the surface of the wafer with which to align the mask. Consequently one edge of the mask is typically aligned with one edge of the wafer by adjusting the position of the wafer with tool 51. Once alignment is achieved, carrier 41 is moved toward wafer 53 along the normal to the wafer until mask 43 and wafer 53 are in contact. Actinic radiation is then directed through the vertical illuminator to expose those areas of the photoresist that are located behind the transparent areas of mask 43.

Figure 4:
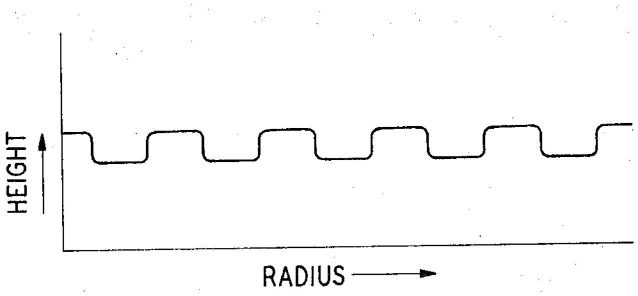
FIG. 4 is a schematic representation of the cross-section of part of a moire grating formed according to my invention.

After the appropriate exposure, the mask and wafer are removed from the alignment apparatus, and the wafer is processed. The processing steps may include an initial treatment of the wafer to harden still further the polymerized portions of the photoresist, removal of the unhardened portions of photoresist to expose portions of the silicon oxide, etching of these portions of the silicon oxide to expose portions of the silicon, removal of the polymerized portions of the photoresist, diffusion of appropriate impurities into the silicon, regrowth of the silicon oxide, and formation of a new layer of photoresist. As a result of these steps, various features of the integrated circuits are formed on those portions of the wafer that were exposed to the integrated circuit patterns on the photolithographic mask. On those portions of the wafer that are exposed to the moire gratings, a set of concentric contours are formed corresponding to the pattern in the mask. For the ordinary photoresist, those regions that were behind the black portions of the moire grating on the mask were not polymerized. Consequently, the photoresist and the silicon oxide in these regions were removed. For the remaining regions, the silicon oxide was not removed. Because the regrowth of the silicon oxide is substantially uniform, these changes in the thickness of the silicon oxide are preserved. Consequently, for each of the moire gratings 11 on mask 21 a moire grating 11 is formed on the substrate comprising one set of concentric regions of one height interleaved with a second set of concentric regions of a second height. An illustration of the relative heights of these regions along a radius of the moire grating is given in FIG. 4.

To align the second photolithographic mask with the substrate, the mask and the substrate are inserted into their respective holders in the alignment apparatus and positioned about 30 microns apart. To a first approximation, alignment between mask and substrate is achieved by moving alignment tool 51 so that one of the gratings 11 on the substrate is under the corresponding moire grating 12 of the second mask. When this degree of alignment is achieved, a moire pattern is formed by the two gratings. Because the two gratings are concentric, this moire pattern has an axis of symmetry on which lie the centers of the moire grating on the mask and the moire grating on the substrate. These centers can readily be seen because some of the moire fringes converge on them.

Angular misalignments are then corrected by the rotating alignment tool 51 so that the second grating 11 on the substrate is under the second grating 12 on the mask. An axis of symmetry is also observed in the moire pattern formed by these two gratings. To attain even more accurate angular alignment, tool 51 is manipulated further until the axes of symmetry of the two moire patterns formed by the two pairs of gratings are parallel. Once this parallelism is achieved, further angular alignment should not be necessary. Accordingly, the remaining discussion of alignment will concentrate on the $x$-$y$ alignment of one grating on the mask with one grating on the substrate.

Figure 5:
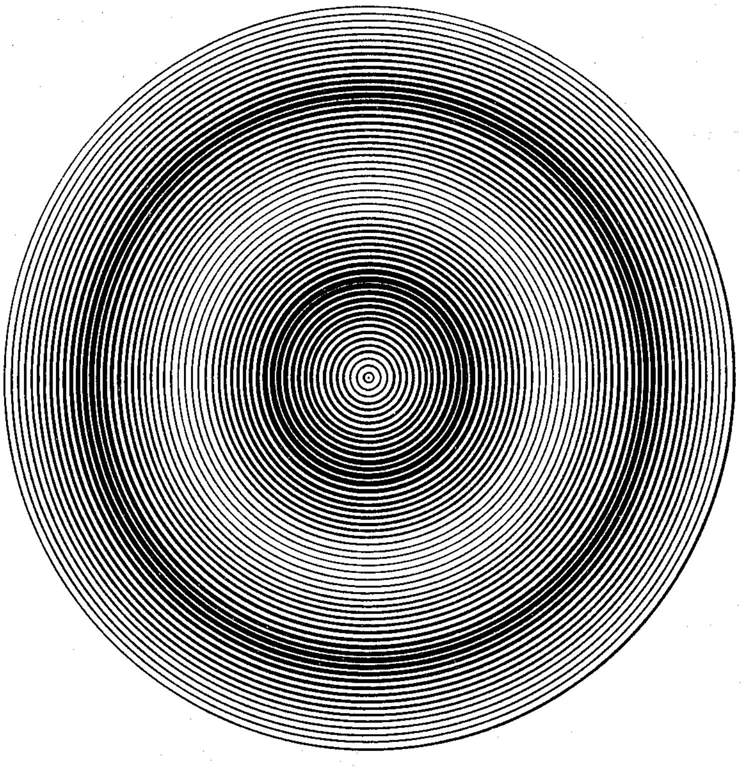
FIG. 5 is a schematic representation of the moire pattern that results when two different-pitch gratings composed of concentric circles are properly aligned or very nearly so.

To improve the $x$-$y$ alignment, alignment tool 51 is manipulated to move the center of the grating on the substrate along the axis of symmetry of the moire pattern toward the center of the grating on the mask. As the alignment improves, the spacing between the fringes increases; and it can be seen that the fringes comprise one family of nested closed loops that have as a common point the center of the grating having the smaller pitch and a second family of nested V-shaped fringes that diverge from the center of the other grating. Eventually, as the centers of the two gratings approach one another, the loops become more circular, the V-shaped fringes begin to curve around the centers of the gratings, and the two patterns start to coalesce. At this point, it is feasible to count the numer of loops that pass through the center of the grating with the smaller pitch. The approximate misalignment of the centers is the product of the number of such loops and one-half the pitch of the larger grating. As alignment continues, fewer and fewer fringes pass through the center of the grating with the smaller pitch. Of those fringes that do not, the ones closer to the centers of the gratings have a cardioid shape while those farther away are approximately circular. When the centers are finally aligned, the moire pattern comprises a set of concentric fringes having a pitch $c$ that is equal to the product of the pitches $a$ and $b$ of the two gratings divided by the absolute value of their difference. Thus, $c = a \cdot b / |a-b|$. A representation of the moire grating that is observed when this degree of alignment is achieved is shown in FIG. 5.

After one pair of gratings is centered as above, the other pair of gratings should be checked for alignment. If all angular misalignments have not been eliminated by the procedures detailed above, the second pair of gratings will display a moire pattern with an axis of symmetry. This pair of gratings is then brought into alignment by manipulating alignment tool 51. This process may require an iterative procedure of approximating the alignment of one pair of gratings and then another until both pairs are aligned. For such work, a standard split-field microscope is preferable.

To attain even more precise alignment, it is possible to align the moire pattern with one of the lines of one of the gratings. Because the moire pattern is in focus at both the mask and the substrate, this can be done by focusing the microscope at either the mask or the substrate and adjusting the position of the substrate so that the center of one of the moire fringes is symmetrically located with respect to one of the nearby lines of the grating. By following these procedures and using circular gratings, I have been able to achieve alignment accuracies of approximately 0.2 microns.

Figure 6:
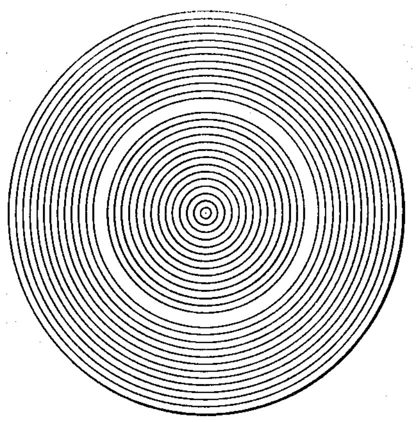
FIG. 6 is an illustration of a portion of a moire grating especially useful in the practice of my invention.
Figure 7:
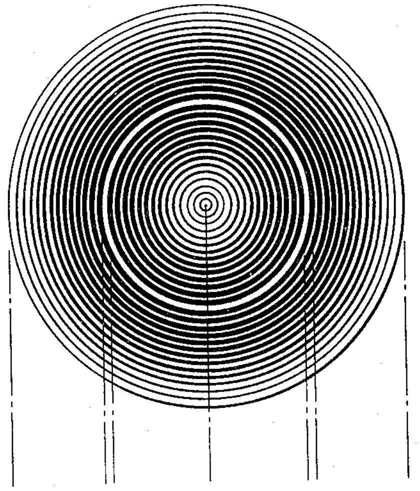
FIG. 7 is a schematic representation of the moire pattern that results when the grating of FIG. 6 is properly aligned with a grating composed of concentric circles having a different pitch.
Figure 8:
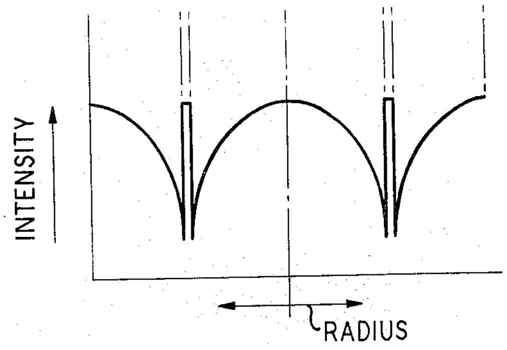
FIG. 8 is a plot of the typical intensity versus radial distance that is observed when the grating of FIG. 6 is properly aligned with a grating composed of concentric circles having a different pitch.

To assist in this step of the alignment, it is possible to code one of the gratings at approximately the location where the moire pattern will be formed. Such a code might be almost any alteration in the appearance of the grating from its appearance as a uniform grating. One such coded grating is shown in FIG. 6. In this case, the coding comprises the absence of one of the lines of the grating at the point where the moire pattern will be observed when the gratings on the mask and the substrate are aligned. When this grating is used in the mask and is aligned with the usual grating on the substrate, a bright circle is formed against which the moire pattern can be aligned simply by positioning the substrate so that the moire pattern is symmetrically displaced from the bright circle. The alignment of the moire pattern with such a circle is represented in FIG. 7. A plot of the relative average intensity of the light from the moire pattern is shown in FIG. 8. The decrease in intensity indicates the general location of a dark fringe in the moire pattern. The peak within this depression represents the location of the bright circle. While, for this example, the moire fringe is centered on the bright circle, other arrangements can readily be used. For example, the bright circle can be located inside or outside the center of the fringe; or a pair of bright circles can be used to center the fringe between. Numerous other codes will readily be apparent.

Once again, after the alignment of one pair of gratings, the other pair of gratings should be checked for alignment; and any angular displacements that are detected should be corrected.

After the mask is aligned with the substrate, carrier 41 is moved toward the substrate to bring the mask into contact with the substrate; and actinic light is directed through the mask to expose those parts of the photoresist that are behind the transparent regions of the mask. The photolithographic processing steps, the etching and the diffusing steps detailed above are repeated for the particular pattern formed this time on the photoresist. Because the region of the substrate where the first grating was formed is directly under grating 12 of the second mask, the processing an etching steps will form on the substrate a record of the moire pattern between the two gratings. Simultaneously, these steps will also form on the substrate a record of grating 11 which is located alongside grating 12 in mask 22. Because grating 11 in mask 22 was formed from the same transparency as grating 11 in mask 21, the record of grating 11 that is formed this time on the substrate is the same except for minor variations that may be introduced by small differences in the exposure, processing or etching steps.

To align mask 23 with the substrate, the same procedure is repreated to align grating 12 on mask 23 with the newly formed record of grating 11 on the substrate. After alignment is attained, the photoresist on the substrate is exposed through the mask and processed, thereby making a record of the moire pattern formed by grating 12 on the mask and grating 11 on the substrate. Simultaneously, a record is made on the substrate of a new grating 11. This process is repeated as many times as necessary to align all the masks with the substrate.

In practicing the alignment process detailed above, I have used pairs of gratings of concentric circles having a diameter of approximately 500 microns and a constant pitch of approximately 4 or 8 microns. The gratings in each pair were similar except for pitch, having been formed at different reduction ratios from a single grating having a pitch of 2 millimeters that was plotted on a Gerber Plotter. In practice, I am able to align the first moire fringe on one of the circular lines of a grating to an accuracy of one pitch width. Because the radius of the first fringe in the moire pattern is equal to $\frac{1}{2}a \cdot b/|a-b|$ where $a$ and $b$ are the pitches of the two gratings, this accuracy can be shown to correspond to an alignment accuracy of $\pm a|a-b|(a/b)$ between the centers of the two gratings. By setting $b=x \cdot a$ where $x$ is the scaling factor between the pitches of the two gratings, the alignment accuracy between the grating centers can be written as $\pm a|(1-x|/x)$. Thus, to achieve an accuracy of one-twentieth the pitch $a$, $|1-x|/x$ is set equal to 1/20; and the required scaling factor is seen to be $x=20/21$. Thus, the pitch of one of the gratings should be approximately 0.95 that of the other grating. By using gratings with pitches of 4 microns and approximately 3.81 microns, the centers of the two gratings can be aligned to an accuracy of about 0.2 microns. In practice, a scaling factor of 0.95 is about the largest factor that should be used and an accuracy of one-twentieth the pitch of the grating is about the best that can be attained conveniently.

When the gratings have a pitch on the order of 2 microns, a microscope with a relatively high numerical aperture is required to resolve the 1 micron width of a line of the grating. The use of such a high numerical aperture and the 30 micron or so separation between the grating on the mask and the grating on the substrate makes it impossible to focus simultaneously on details on both the mask and the substrate. This, however, is not a serious inconvenience in my invention because the moire pattern formed by the gratings is not localized in space and is in focus at both the mask and the substrate. Hence, alignment can be achieved merely by focusing on the mask and aligning the moire pattern at that location. In contrast to the prior art, it is not necessary to change focus continually between substrate and mask.

When the gratings, have a pitch such as 8 microns, high numerical apertures are not required. However, extremely good alignment tolerances in the submicron range can still be attained by aligning the moire fringe pattern symmetrically on one of the lines of the grating. Because low numerical apertures can be used in these cases, it is possible to achieve good contrast in the alignment procedures as well as avoid operator fatigue that is encountered in the use of high numerical aperture microscopes.

As indicated above, I have used moire gratings comprising concentric circles of different pitch in practicing my invention. I prefer concentric gratings for several reasons. This type of grating provides information sufficient for alignment in two orthogonal directions. It is relatively easy to make and reasonably independent of irregularities that may arise during its fabrication. The moire pattern formed by a pair of such gratings is relatively uncomplicated and gives a positive indentification when alignment is achieved. While the symmetry of concentric circles makes their use especially attractive, other concentric patterns, such as concentric sets of polygons, can also be used.

If desired, the alignment procedure I have detailed above can also be implemented by machine. This implementation requires an array of photodetectors on which is imaged the moire pattern formed by the gratings, a computer to analyze the pattern and generate control signals and an automatic alignment tool. All this equipment is available in the art. To provide sufficient detail the photodetector array should contain approximately $10^4$ photodiodes. The computer must be capable of analyzing this input and directing the alignment tool to move the substrate into alignment with the mask.

Briefly, a suitable alignment procedure would be as follows. After the mask and substrate are positioned in the device, the grating on the substrate is moved into a position where a moire pattern is formed. The computer then determines the axis of symmetry of the pattern and corrects for angular misalignment by making this axis parallel with the axis of symmetry of a second pair of gratings. The substrate is then moved so that the center of the grating on the substrate moves toward the center of the corresponding grating on the mask. When the gratings form the moire pattern indicative of alignment, the procedure is complete.

As will be obvious to those skilled in the art, my invention is broadly applicable to the problem of attaining extremely precise alignment. While I have illustrated its use with an example drawn from the semiconductor art, my invention may also be used in the fabrication of other devices such as magnetic domain devices. As indicated above, the particular moire gratings used should be comprised of concentric lines but these lines do not have to be circles. The particular alignment apparatus and photolithographic procedures that are used can be any used in the art. Numerous other modifications and embodiments of my invention may be devised by those skilled in the art without departing from the spirit and scope of my invention.

What is claimed is:

1. A method of aligning two objects comprising the steps of:

forming on the surface of the first object a first moire grating comprising an array of concentric regions having a substantially constant first pitch $a$;

forming on the second object a second moire grating having a substantially constant second pitch $b$ which is smaller than pitch $a$;

aligning the first and second moire gratings so as to form a moire pattern comprising an array of concentric regions having a substantially constant third pitch $c$, where $c = a \cdot b / |a-b|$ ; and aligning one of the concentric regions of the moire pattern with a concentric region of either the first or second moire grating.

* * * * *